United States Patent
Kang (10) Patent No.: US 7,619,433 B2
(45) Date of Patent: Nov. 17, 2009

(54) TEST CIRCUIT FOR A SEMICONDUCTOR INTEGRATED CIRCUIT

(75) Inventor: Shin-Deok Kang, Ichon (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 12/181,226

(22) Filed: Jul. 28, 2008

(65) Prior Publication Data
US 2009/0174425 A1    Jul. 9, 2009

(30) Foreign Application Priority Data
Jan. 7, 2008  (KR) .................. 10-2008-0001581

(51) Int. Cl.
*G01R 31/26* (2006.01)
(52) U.S. Cl. .................. 324/763; 324/765; 365/189.04; 365/230.08
(58) Field of Classification Search .................. None
See application file for complete search history.

(56) References Cited

U.S. PATENT DOCUMENTS

| | | | |
|---|---|---|---|
| 6,252,804 B1 * | 6/2001 | Tomita .................. | 365/189.05 |
| 6,704,229 B2 | 3/2004 | Haraguchi et al. | |
| 7,453,744 B2 * | 11/2008 | Kang .................. | 365/189.16 |
| 2007/0018637 A1 | 1/2007 | Kim et al. | |
| 2008/0013389 A1 | 1/2008 | Kim et al. | |

FOREIGN PATENT DOCUMENTS

| | | |
|---|---|---|
| JP | 2003-066108 | 3/2003 |
| KR | 1020000022569 | 4/2000 |

* cited by examiner

*Primary Examiner*—Minh N Tang
(74) *Attorney, Agent, or Firm*—Baker & McKenzie LLP (57) ABSTRACT

A test circuit includes an output control section for generating a plurality of output buffer control signals in response to a plurality of data masking signals when a test mode signal is activated in read operation; and a data output buffer for masking some of data input and output pins in response to the plurality of output buffer control signals.

20 Claims, 5 Drawing Sheets

TEST CIRCUIT FOR A SEMICONDUCTOR INTEGRATED CIRCUIT

CROSS-REFERENCES TO RELATED APPLICATION

The present application claims priority under 35 U.S.C. 119(a) to Korean Patent Application number 10-2008-0001581, filed on Jan. 7, 2008, in the Korean Intellectual Property Office, the contents of which are incorporated herein by reference in their entirety as if set forth in full.

BACKGROUND

1. Technical Field

The embodiments described herein relate to a semiconductor integrated circuit, and more particularly, to a test circuit for a semiconductor integrated circuit.

2. Related Art

In general, the input and output modes of a conventional semiconductor integrated devices can be divided into an X4 input and output mode, an X8 input and output mode, an X16 input and output mode, and so on, depending upon the number of input and output pins. These input and output modes can determine the bandwidths of data that can be processed at a time.

To decrease the test time when testing conventional semiconductor integrated circuits, a number of semiconductor integrated circuits are simultaneously tested in parallel. In this case, the input and output pins of a tester must be assigned in accordance with the configuration of a semiconductor integrated circuit to be tested. That is to say, when testing a semiconductor integrated circuit having an X32 input and output mode, 32 input and output pins of a tester must be assigned in accordance with the X32 input and output mode. Consequently, the number of semiconductor integrated circuits to be tested in parallel is limited due to the limited number of the input and output pins of the tester. This limit on the number of circuits that can be tested in parallel, necessarily increases the overall test time.

In certain instances, the input and output mode of an internal circuit is changed to an X16 input and output mode so that the test can be conducted by compressing input and output pins in order to improve the efficiency of the parallel test; however, defects in certain input and output pins may not be detected when this is done.

SUMMARY

A semiconductor integrated circuit includes a test circuit capable of decreasing the number of input and output pins of a tester in read operation while maintaining sufficient operation.

According to one aspect of the present invention, there is provided a test circuit comprising an output control section for generating a plurality of output buffer control signals in response to a plurality of data masking signals when a test mode signal is activated in read operation; and a data output buffer for masking some of data input and output pins in response to the plurality of output buffer control signals.

According to another aspect of the present invention, there is provided a test circuit comprising a masking control block for generating a plurality of output buffer control signals in response to a plurality of data masking signals when a test mode signal is activated in read operation; and a data output buffer controlled in paths of output data in response to the plurality of output buffer control signals.

According to still another aspect of the present invention, there is provided a test circuit comprising a data input and output control block capable of masking some of data input and output pins in write operation and read operation in response to a plurality of data masking signals when a test mode signal is activated, the data input and output control block comprising an output control section for generating a plurality of output buffer control signals in response to the plurality of data masking signals in read operation; and a data output buffer controlled in activation and inactivation thereof in response to the plurality of output buffer control signals and thereby selectively masking different groups of data input and output pins.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to embodiments described herein, the data output when a semiconductor integrated circuit operates is read twice such that the number of data input and output pins of an external tester can be controlled. That is to say, data is output twice in read operation by masking a predetermined group unit of data input and output pins, respectively. Thus, the number of data input and output pins, which are accessed at a time by the external tester, decreases to one half of the number of the data input and output pins used in an internal circuit operation. Therefore, because the utilization efficiency of the pins of the tester can be improved, costs can be decreased. Also, since the number of semiconductor circuit devices to be tested in parallel can be increased, the overall test time can be shortened and thereby productivity can be increased.

Figure 1:
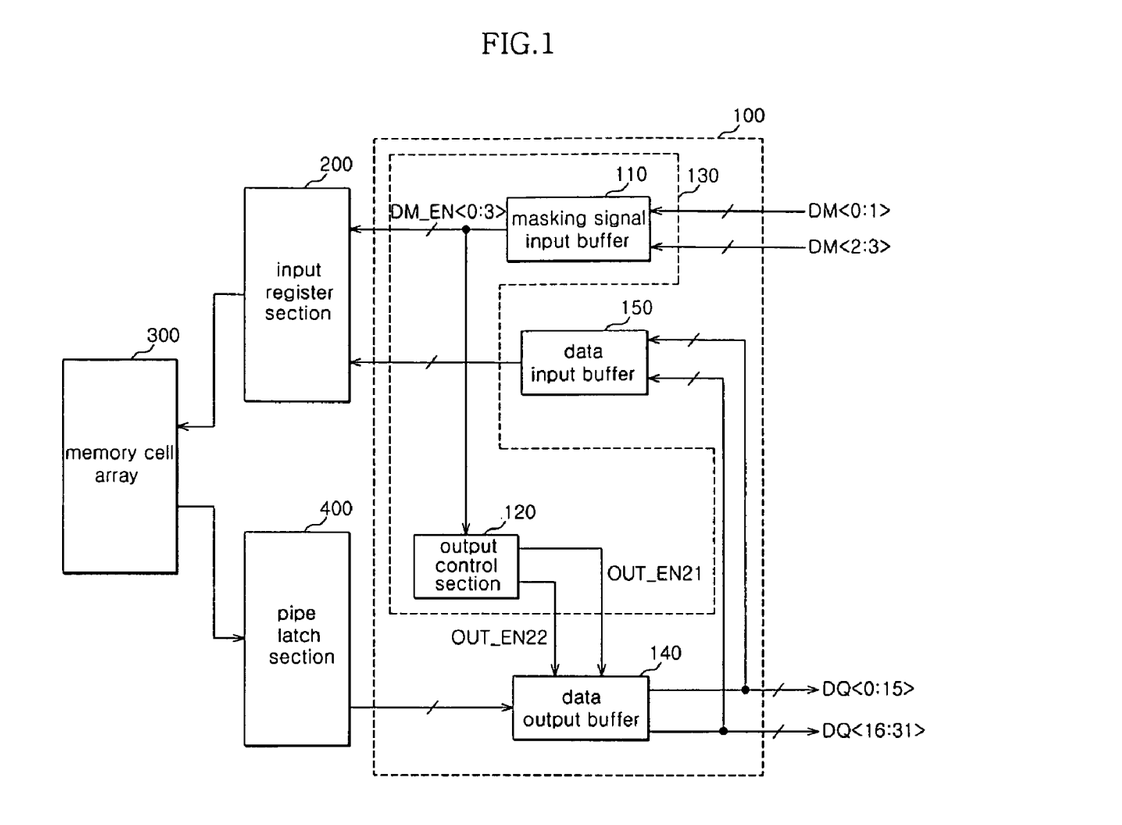
FIG. 1 is a block diagram illustrating a semiconductor integrated circuit having a test circuit in accordance with one embodiment.

In the embodiment illustrated in FIG. 1, an X32 input and output mode will be exemplified.

Referring to FIG. 1, a semiconductor integrated circuit includes a data input and output control block 100, an input register section 200, a memory cell array 300, and a pipe latch section 400. First, the data input and output control block 100 according to this embodiment can control the masking of data input and output pins DQ<0:31> in write operation as well as read operation. The data input and output control block 100 includes a masking control sub-block 130, a data output buffer 140, and a data input buffer 150. The masking control sub-block 130 includes a masking signal input buffer 110 and an output control section 120.

The masking signal input buffer 10 buffers first through fourth masking signals 'DM<0:3>' and generates masking activation signals 'DM_EN<0:3>'. Here, each of the first through fourth masking signals 'DM<0:3>' or each of the first through fourth masking activation signals 'DM_EN<0:3>' are signals for masking data input and output pins for one byte. For example, the first masking activation signal 'DM_EN<0>' controls the masking of first through eighth data input and output pins DQ<0:7>, and the second masking activation signal 'DM_EN<1>' controls the masking of ninth through sixteenth data input and output pins DQ<8:15>.

In this embodiment, since 32 data input and output pins DQ<0:31> are used, four masking activation signals are needed to control the masking of these pins. However, the embodiments described herein are not limited by the number of masking activation signals, and therefore, the number of the masking activation signals can be changed depending upon the configuration of a semiconductor integrated circuit or an input and output mode. Also, while the first and second masking signals 'DM<0:1>' and the third and fourth masking signals 'DM<2:3>' are illustrated separately from each other for the sake of convenience in explanation, this does not have any special meaning.

The illustration indicates that one test masking pin channel (not shown) of an external tester (not shown) is assigned to two masking signals. This will be described later in detail. The first through fourth masking signals 'DM<0:3>' and the first through fourth masking activation signals 'DM_EN<0:3>' can, depending on the embodiment, be considered as the same signals.

The output control section 120 generates first and second output buffer control signals 'OUT_EN21' and 'OUT_EN22' in response to the first through fourth masking activation signals 'DM_EN<0:3>'. In particular, the output control section 120 according to this embodiment generates the first and second output buffer control signals 'OUT_EN21' and 'OUT_EN22' in response to a read command in a test mode selectively to mask the data input and output pins DQ<0:31>. The first and second output buffer control signals 'OUT_EN21' and 'OUT_EN22' are signals to control whether the data output buffer 140 is activates. More specifically, the first output buffer control signal 'OUT_EN21' controls the masking of the sixteen data input and output pins DQ<0:15> of the data output buffer 140. Also, the second output buffer control signal 'OUT_EN22' controls the masking of the other sixteen data input and output pins DQ<16:31> of the data output buffer 140.

Meanwhile, the data input buffer 150 receives and buffers the data inputted from the data input and output pins DQ<0:31>.

The input register section 200 receives the buffered input data. The input register section 200 parallelizes the serialized input data and transmits the parallelized input data to the memory cell array 300. At this time, the input data, which is received by the input register section 200, can be masked in response to the activated first through fourth masking signals 'DM<0:3>', as in the case of usual write masking operation.

The input data stored in the memory cell array 300 is sensed by a sense amplifier (not shown) and is then stored in the pipe latch section 400.

The pipe latch section 400 serializes the data which is received in the parallelized state, in response to a read command, and then provides the serialized data to the data output buffer 140.

The data output buffer 140 provides output data to the data input and output pins DQ<0:31> under the control of the first and second output buffer control signals 'OUT_EN21' and 'OUT_EN22'. Upon the activation of a test mode and in read operation, the data output buffer 140 according to this embodiment of the present invention operates selectively to mask the data input and output pins.

Here, in accordance with one example embodiment, the following description will be given by grouping the first through sixteenth data input and output pins into a first data pin group DQ<0:15> and the seventeenth through thirty second data input and output pins into a second data pin group DQ<16:31>. Also, in correspondence with this, it is assumed that an external tester (not shown) is provided in a state in which one test input and output pin channel group (for example, DQ_CH<0:15>) of the external tester is connected in advance with the first and second data pin groups DQ<0:15> and DQ<16:31>.

Hence, the data output buffer 140 according to this embodiment responds to a read command in a test mode and masks the first data pin group DQ<0:15> and the second data pin group DQ<16:31> selectively such that the limited test input and output pin channel group of the external tester can be used. Thus, in a test mode according to this embodiment the efficiency of a parallel test can be improved, since the number of input and output channels of the external tester are decreased to one half the number needed in a conventional tester.

The control of the data output buffer 140 in read operation under a test mode will be described below in detail with reference to the drawings.

Figure 2:
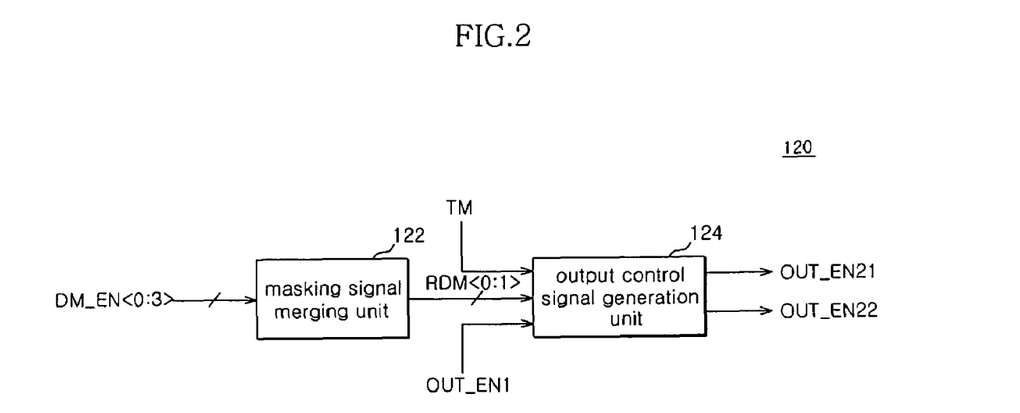
FIG. 2 is a block diagram illustrating the output control section shown in FIG. 1.

Referring to FIG. 2, the output control section 120 includes a masking signal merging unit 122 and an output control signal generation unit 124.

The masking signal merging unit 122 merges the first through fourth masking activation signals 'DM_EN<0:3>' and generates first and second read masking signals 'RDM<0:1>'. For example, the masking signal merging unit 122 merges the first and third masking activation signals 'DM_EN<0,2>' and generates the first read masking signal 'RDM<0>'. Also, the masking signal merging unit 122 merges the second and fourth masking activation signals 'DM_EN<1,3>' and generates the second read masking signal 'RDM<1>'.

The output control signal generation unit 124 generates the first and second output buffer control signals 'OUT_EN21' and 'OUT_EN22' in response to a test mode signal 'TM', the first and second read masking signals 'RDM<0:1>' and a first output control signal 'OUT_EN1'.

Here, the first read masking signal 'RDM<0>' and the second read masking signal 'RDM<1>' are exemplified as having respective exclusive signal levels.

Therefore, when the test mode signal 'TM', the first read masking signal 'RDM<0>' and the first output control signal 'OUT_EN1' are all activated, the output control signal generation unit 124 provides an inactivated first output buffer control signal 'OUT_EN21'. At the same time, the output control signal generation unit 124 provides an activated second output buffer control signal 'OUT_EN22'. Otherwise, the output control signal generation unit 124 can provide an inactivated second output buffer control signal 'OUT_EN22' and at the same time an activated first output buffer control signal 'OUT_EN21', in response to the test mode signal 'TM', the first output control signal 'OUT_EN1' and the second read masking signal 'RDM<1>'.

Meanwhile, the test mode signal 'TM' may be exemplified as the signal that is stored in an MRS (mode register set) or a TMRS (test mode register set). Further, the first output control signal 'OUT_EN1' may be a signal that is activated in response to a read command. More specifically, the first output control signal 'OUT_EN1' is activated to a high level ahead of predetermined time than the output time of first output data. Also, the first output control signal 'OUT_EN1' is inactivated to a low level after a predetermined time than the output time of last output data. While the predetermined time can, for example, be one of clock period, the predetermined time can be changed depending upon the configuration or the scheme of a circuit. In this regard, any signal can be used as long as it is activated before the output time of the first data and is inactivated after the output time of the last data so as to ensure the stability of output data.

Figure 3:
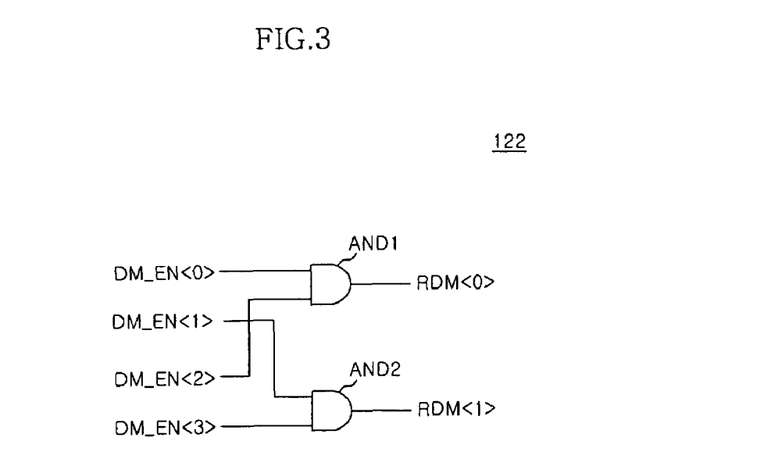
FIG. 3 is a circuit diagram illustrating the masking signal merging unit shown in FIG. 2.

FIG. 3 is a circuit diagram illustrating the masking signal merging unit 122 shown in FIG. 2.

Referring to FIG. 3, the masking signal merging unit 122 includes first and second AND gates AND1 and AND2. The first AND gate AND1 merges the first and third masking activation signals 'DM_EN<0, 2>' and generates the first read masking signal 'RDM<0>'. The second AND gate AND2 merges the second and fourth masking activation signals 'DM_EN<1,3>' and generates the second read masking signal 'RDM<1>'.

As described above, when compared to a conventional tester, a decreased number of channels equipped to an external tester are used in a test mode. That is to say, for example, corresponding to the first through fourth masking signals 'DM<0:3>' or the first through fourth masking activation signals 'DM_EN<0:3>', the masking pin channels (for example, DM_CH<0:1>) of the external tester can be arranged. It is appreciated that the masking pin channel DM_CH<0> is assigned to correspond to the first and third masking activation signals 'DM_EN<0,2>' and the masking pin channel DM_CH<1> is assigned to correspond to the second and fourth masking activation signals 'DM_EN<1, 3>'. Therefore, since the number of the assigned masking pin channels decreases to one half when compared to a conventional tester, the efficiency of a parallel test can be improved.

Accordingly, in correspondence with this, the masking signal merging unit 122 is provided to generate merged first and second read masking signals 'RDM<0:1>'. Thus, the first and third masking activation signals 'DM_EN<0,2>' are the same signals that are transmitted from one channel of the tester. Also, since the second and fourth masking activation signals 'DM_EN<1,3>' are the signals transmitted from the other channel of the tester, they have the same level. While it was exemplified that the AND gates are used such that the merged first and second read masking signals 'RDM<0:1>' are provided in correspondence with the first and third masking signals 'DM_EN<0,2>' and the second and fourth masking signals 'DM_EN<1,3>'. However it is to be noted that the embodiments described herein are not limited by a specific use of AND gates. Since the same signals are provided, it is possible to use OR gates.

As a consequence, if the first and third masking activation signals 'DM_EN<0,2>' have a high level, an activated first read masking signal 'RDM<0>' with high level is provided. Also, if the second and fourth masking activation signals 'DM_EN<1,3>' have a high level, an activated second read masking signal 'RDM<1>' with high level is provided. As described above, the first and third masking activation signals 'DM_EN<0:2>' are signals capable of controlling the masking of the sixteen data input and output pins. Therefore, the first read masking signal 'RDM<0>' as having the same function is a signal capable of controlling the masking of the sixteen data input and output pins. It is to be understood that the same principle is applied to the second read masking signal 'RDM<1>'.

Figure 4:
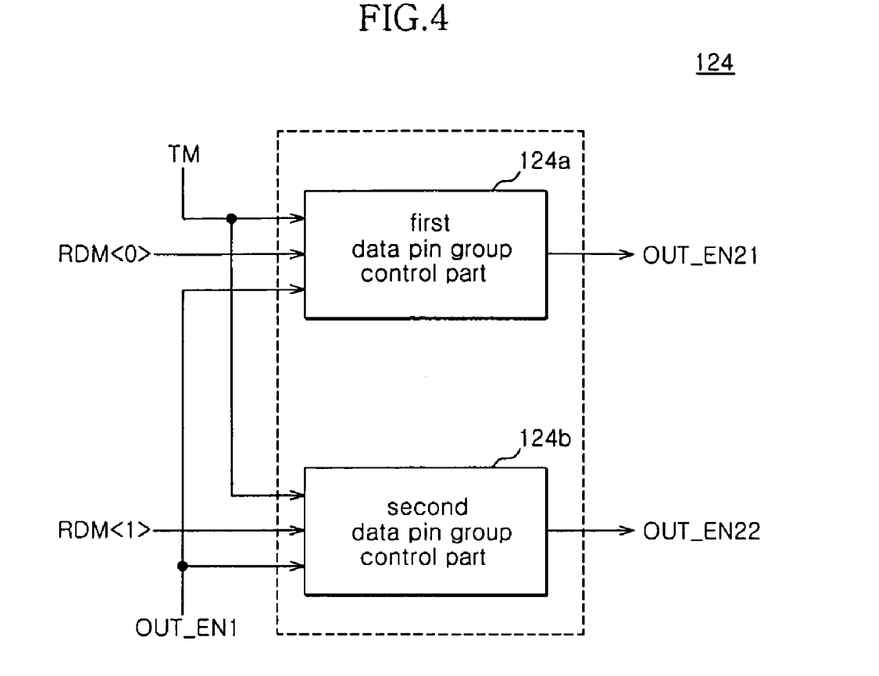
FIG. 4 is a block diagram illustrating the output control signal generation unit shown in FIG. 2.

FIG. 4 is a block diagram illustrating the output control signal generation unit 124 shown in FIG. 2. Referring to FIG. 4, the output control signal generation unit 124 includes a first data pin group control part 124a and a second data pin group control part 124b.

The first data pin group control part 124a provides the first output buffer control signal 'OUT_EN21' in response to the test mode signal 'TM', the first output control signal 'OUT_EN1' and the first read masking signal 'RDM<0>'. Similarly, The second data pin group control part 124b provides the second output buffer control signal 'OUT_EN22' in response to the test mode signal 'TM', the first output control signal 'OUT_EN1' and the second read masking signal 'RDM<1>'.

Meanwhile, the first data pin group control part 124a and the second data pin group control part 124b are different from each other only in that different output signals are provided depending upon the received first and second read masking signals 'RDM<0:1>'. Therefore, since the structures of the first data pin group control part 124a and the second data pin group control part 124b are the same, concrete description will be given only for the first data pin group control part 124a so as to avoid repetition of description.

Figure 5:
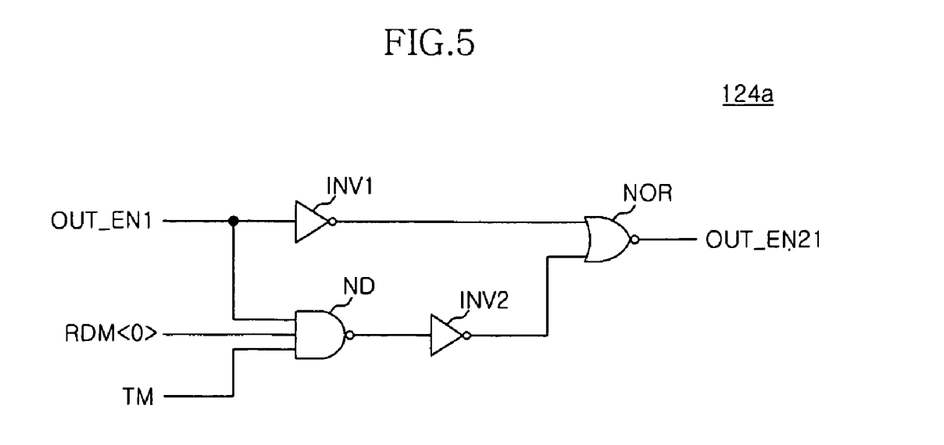
FIG. 5 is a circuit diagram illustrating the first data pin group control part shown in FIG. 4.

Referring to FIG. 5, the first data pin group control part 124a includes first and second inverters INV1 and INV2, a NAND gate ND, and a NOR gate NOR.

The NAND gate ND NAND operates the first output control signal 'OUT_EN1', the first read masking signal 'RDM<0>' and the test mode signal 'TM' and outputs a signal to the second inverter INV2. The NOR gate 'NOR' NOR operates the output signal of the first inverter INV1 and the output signal of the second inverter INV2 and outputs the first output buffer control signal 'OUT_EN21'.

The operation of the first data pin group control part 124a will be described below.

First, in response to a read command, the first output control signal 'OUT_EN1' for activating the output of data is activated. Also, in the test mode, the test mode signal 'TM' is activated. At this time, when the first read masking signal 'RDM<0>' is activated, since the NAND gate ND receives all high levels, the NAND gate ND provides a signal having a low level. Thereafter, a high level is provided via the second inverter INV2 to one terminal of the NOR gate NOR. Hence, according to the operation principle of the NOR gate NOR, the first output buffer control signal 'OUT_EN21' having a low level is provided.

When a read command is received under the test mode, if the first read masking signal 'RDM<0>' is inactivated to have a low level, the NAND gate ND provides a signal having a high level. A low level is provided from the second inverter INV2 to one terminal of the NOR gate NOR, and also a low level is provided from the first inverter INV1 to the other terminal of the NOR gate NOR. As a consequence, the first data pin group control part 124a provides the first output buffer control signal 'OUT_EN21' with high level.

Next, operation under a normal mode will be described below. In this case, since the test mode signal 'TM' has a low level, the output of the NAND gate ND has a high level. Upon a read command, since both terminals of the NOR gate NOR receive low levels, the NOR gate NOR provides the first output buffer control signal 'OUT_EN21' with high level.

As described above, when the first read masking signal 'RDM<0>' is activated upon a read command under the test mode, the first data pin group DQ<0:15> (see FIG. 1) is masked. Thus, in order to prevent output data from being provided to the first data pin group DQ<0:15>, the first output buffer control signal 'OUT_EN21' with low level is provided. However, upon a read command under the test mode, when the first read masking signal 'RDM<0>' is inactivated, the first data pin group DQ<0:15> is not masked. Therefore, in order to allow the output data to be provided to the first data pin group DQ<0:15>, the first output buffer control signal 'OUT_EN21' is provided as an activated signal with high level. Meanwhile, under the normal mode, when the read command is activated, the activated first output buffer control signal 'OUT_EN21' with high level is provided.

In other words, the activation or inactivation of the data output buffer 140 (see FIG. 1) is controlled by the first output buffer control signal 'OUT_EN21' (or the second output buffer control signal 'OUT_EN22'). Hence, depending upon the signal level of the first read masking signal 'RDM<0>' can determine whether the first data pin group DQ<0:15> is masked. Thereupon, in order to allow the data output buffer 140 to operate in response to the determination, the first output buffer control signal 'OUT_EN21' is provided.

Figure 6:
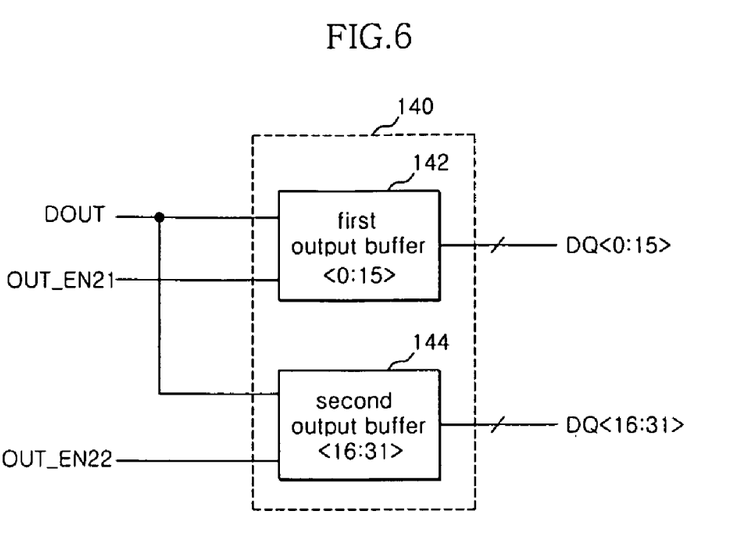
FIG. 6 is a block diagram illustrating the data output buffer shown in FIG. 1.

Referring to FIG. 6, the data output buffer 140 includes a first output buffer 142 and a second output buffer 144.

First, the first output buffer 142 has a plurality of buffer units (not shown) and controls the first data pin group DQ<0:15> in response to output data 'DOUT' and the first output buffer control signal 'OUT_EN21'. That is to say, depending upon the signal level of the first output buffer control signal 'OUT_EN21', the output path of the output data 'DOUT' can be provided or blocked.

Similarly, the second output buffer 144 has a plurality of buffer units (not shown) and controls the second data pin group DQ<16:31> in response to output data 'DOUT' and the second output buffer control signal 'OUT_EN22'. That is to say, depending upon the signal level of the second output buffer control signal 'OUT_EN22', the output path of the output data 'DOUT' can be provided or blocked.

The first and second output buffers 142 and 144 provide the output data 'DOUT' by the same configuration and operation principle, and are different from each other only by the fact that they respectively response to the first and second output buffer control signals 'OUT_EN21' and 'OUT_EN22'. That is to say, the first and second output buffers 142 and 144 control different data pin groups. Therefore, repeated description will be omitted herein, and the configuration and the operation of the second output buffer 144 will be omitted by describing those of the first output buffer 142.

While the first output buffer 142 has the plurality of buffer units corresponding to the respective data input and output pins DQ<0:15>, only the buffer unit connected with one data pin (for example, the data pin DQ<0>) will be described for the sake of convenience in explanation.

Figure 7:
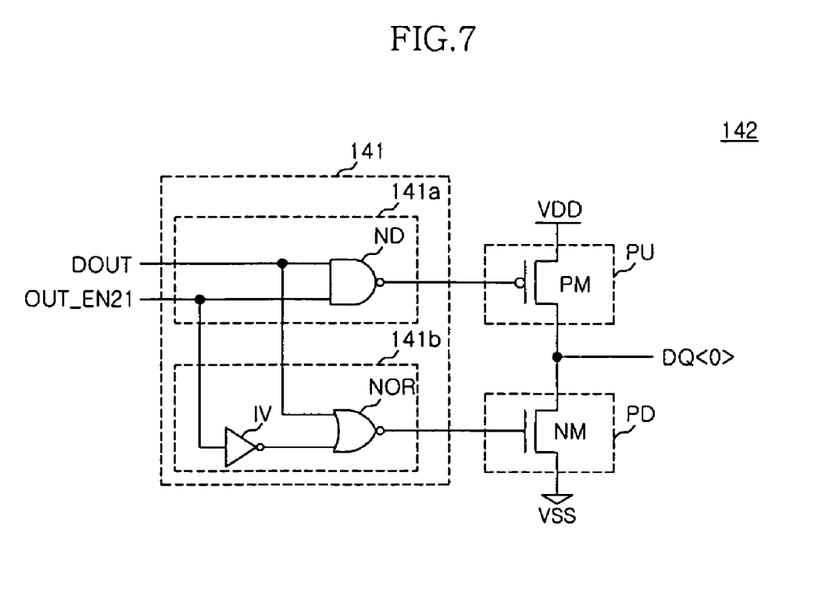
FIG. 7 is a circuit diagram illustrating the first output buffer shown in FIG. 6.

Referring to FIG. 7, the first output buffer 142 includes a control element 141, a pull-up element PU and a pull-down element PD.

First, the control element 141 controls the activation of the pull-up element PU and the pull-down element PD in response to the output data 'DOUT' and the first output buffer control signal 'OUT_EN21'. The control element 141 includes a pull-up control element 141a and a pull-down control element 141b.

In detail, the pull-up control element 141a controls the activation of the pull-up element PU in response to the first output buffer control signal 'OUT_EN21' and the output data 'DOUT'. The pull-up control element 141a includes a NAND gate ND. The NAND gate ND controls the activation of the pull-up element PU depending upon the signal level of the output data 'DOUT' when the NAND gate ND receives the activated first output buffer control signal 'OUT_EN21' with high level. However, if the NAND gate ND receives the inactivated first output buffer control signal 'OUT_EN21' with low level, outputs a signal with high level irrespective of the signal level of the output data 'DOUT'. Accordingly, thereafter, the pull-up element PU is inactivated.

The pull-down control element 141b controls the activation of the pull-down element PD in response to the first output buffer control signal 'OUT_EN21' and the output data 'DOUT'. The pull-down control element 141b includes an inverter IV and a NOR gate NOR. The inverter IV inverts the first output buffer control signal 'OUT_EN21' and provides the inverted signal to one terminal of the NOR gate NOR. The NOR gate 'NOR' NOR operates the output data 'DOUT' and the inverted level of the first output buffer control signal 'OUT_EN21'. Thus, when the pull-down control element 141b receives the activated first output buffer control signal 'OUT_EN21' with high level, and controls the activation of the pull-down element PD depending upon the signal level of the output data 'DOUT'. However, when the pull-down control element 141b receives the inactivated first output buffer control signal 'OUT_EN21' with low level, and outputs a signal with low level irrespective of the signal level of the output data 'DOUT'. Accordingly, thereafter, the pull-down element PD is inactivated.

The pull-up element PU is activated in response to the output signal of the pull-up control element 141a. The pull-up element PU includes a PMOS transistor PM. When a signal of a low level is received from the pull-up control element 141a, the PMOS transistor PM is turned on and provides a signal of a high level to the first data input and output pin DQ<0>. When a signal of a high level is received from the pull-up control element 141a, the PMOS transistor PM is turned off and a signal is not provided to the first data input and output pin DQ<0>.

The pull-down element PD is activated in response to the output signal of the pull-down control element 141b. The pull-down element PD includes an NMOS transistor NM. When a signal of a high level is received from the pull-down control element 141b, the NMOS transistor NM is turned on and provides a signal of a low level to the first data input and output pin DQ<0>. When a signal of a low level is received from the pull-down control element 141b, the NMOS transistor NM is turned off and a signal is not provided to the first data input and output pin DQ<0>.

Hereafter, the operation of the first output buffer 142 will be described by continuously referring to FIG. 7.

The case that the first output buffer control signal 'OUT_EN21' is activated will be described. In this case, the pull-up element PU or the pull-down element PD is turned on depending upon the signal level of the output data 'DOUT'. In detail, when the output data 'DOUT' has a high level, since the NAND gate ND provides a low level, the PMOS transistor PM is turned on. By this fact, a signal of a high level is provided to the first data input and output pin DQ<0>. However, when the output data 'DOUT' has a low level, since the NOR gate NOR provides a high level, the NMOS transistor NM is turned on. By this fact, a signal of a low level is provided to the first data input and output pin DQ<0>.

On the contrary, the case that the first output buffer control signal 'OUT_EN21' is inactivated with low level will be described. In this case, the NAND gate ND, which receives a low level through one receiving terminal thereof, provides a high level. Therefore, the PMOS transistor PM is turned off. Further, the NOR gate NOR, which receives a high level through one receiving terminal thereof, provides a low level.

Therefore, the NMOS transistor NM is also turned off. By this fact, in the case that the first output buffer control signal 'OUT_EN21' is inactivated, data cannot be outputted to the first data pin group DQ<0:15>. As described above, the case that the first output buffer control signal 'OUT_EN21' is inactivated corresponds to the case that the first read masking signal 'RDM<0>' is activated. Accordingly, if the first read masking signal 'RDM<0>' is activated, the first output buffer 142 is inactivated, and the first data input and output pin DQ<0> is masked.

The operation of the semiconductor integrated circuit in accordance with one embodiment will be described with reference to FIGS. 1 through 8. It is assumed that the burst length (BL) of data to be inputted and outputted is 4.

Figure 8:
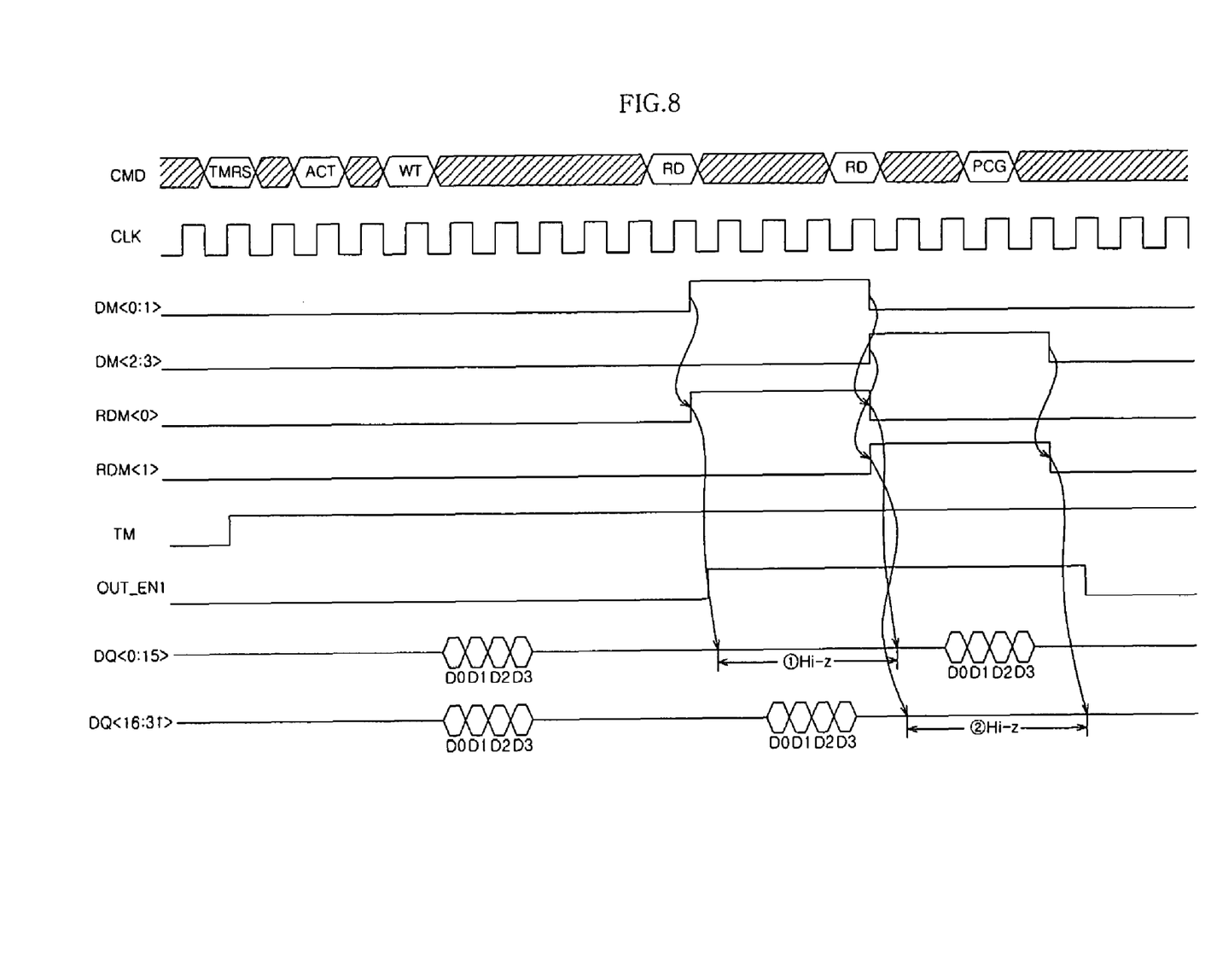
FIG. 8 is a timing diagram illustrating the operation of the test circuit shown in FIG. 1.

As the activated test mode signal 'TM' is provided from the TMRS, the semiconductor integrated circuit enters a test mode.

Upon a write command 'WT', input data D0, D1, D2 and D3 is inputted through the first data pin group DQ<0:15> and the second data pin group DQ<16:31>. Thereafter, upon a first read command 'RD', the first and second masking signals 'DM<0:1>' are activated to a high level. In response to this, the first read masking signal 'RDM<0>' is activated. Meanwhile, in response to the read command, the first output control signal 'OUT_EN1' is activated after a predetermined time. Accordingly, since the test mode signal 'TM', the first output control signal 'OUT_EN1' and the first read masking signal 'RDM<0>' are all activated with high level, the first output buffer control signal 'OUT_EN21' becomes a low level. Therefore, the first data pin group DQ<0:15> is masked with high impedance section ①Hi-z. At this time, the output data D0, D1, D2 and D3 can be provided only through the second data pin group DQ<16:31>.

In response to a second read command 'RD', the second read masking signal 'RDM<1>' is activated. At this time, the first output control signal 'OUT_EN1', which is activated by the first read command 'RD', is continuously maintained in an activated state by the second read command 'RD'. Accordingly, since the test mode signal 'TM', the first output control signal 'OUT_EN1' and the second read masking signal 'RDM<1>' are all activated with high level, the second output buffer control signal 'OUT_EN22' becomes a low level. Therefore, the second data pin group DQ<16:31> is masked and has a high impedance section ②Hi-z. At this time, the output data D0, D1, D2 and D3 can be provided only through the first data pin group DQ<0:15>.

As is apparent from the above description, in one embodiment, in read operation, data input and output pins are controlled by being divided into two groups in a manner such that the number of data input and output pins, which are assigned to a tester, is controlled. That is to say, by implementing masking twice for two respective data pin groups, data is outputted twice. By this fact, because the utilization efficiency of the pins of the tester as limited sources can be improved, costs can be decreased. Also, since a production time can be shortened, the productivity can be increased.

Although specific embodiments have been described for illustrative purposes, those skilled in the art will appreciate that various modifications, additions and substitutions are possible, without departing from the scope and the spirit of the invention as disclosed in the accompanying claims.

What is claimed is:

1. A test circuit of semiconductor integrated circuit comprising:
    an output control section for generating a plurality of output buffer control signals in response to a plurality of data masking signals when a test mode signal is activated in read operation; and
    a data output buffer for masking some of data input and output pins in response to the plurality of output buffer control signals.

2. The test circuit of semiconductor integrated circuit according to claim 1, wherein the output control section comprises:
    a masking signal merging unit for generating a plurality of read masking signals in response to the plurality of data masking signals; and
    an output control signal generation unit for generating the plurality of output buffer control signals in respective response to the plurality of read masking signals.

3. The test circuit of semiconductor integrated circuit according to claim 2, wherein the output control signal generation unit provides a correspondingly inactivated output buffer control signal when any one signal of the plurality of read masking signals is activated.

4. The test circuit of semiconductor integrated circuit according to claim 1, wherein the test circuit further comprises different groups of data input and output pins, which respectively correspond to the plurality of output buffer control signals, and the data output buffer comprises a plurality of output buffers which are respectively connected with the different groups of data input and output pins.

5. The test circuit of semiconductor integrated circuit according to claim 4, wherein, when any one signal of the plurality of output buffer control signals is inactivated, a group of data input and output pins, which corresponds to the inactivated signal, is masked.

6. A test circuit of semiconductor integrated circuit comprising:
    a masking control block for generating a plurality of output buffer control signals in response to a plurality of data masking signals when a test mode signal is activated in read operation; and
    a data output buffer controlled in paths of output data in response to the plurality of output buffer control signals.

7. The test circuit of semiconductor integrated circuit according to claim 6, wherein the masking control block comprises an output control section for merging the plurality of data masking signals into predetermined groups and generating the plurality of output buffer control signals for the respective predetermined groups.

8. The test circuit of semiconductor integrated circuit according to claim 7, wherein the output control section comprises:
    a masking signal merging unit for generating a plurality of read masking signals in response to the plurality of data masking signals; and
    an output control signal generation unit for generating the plurality of output buffer control signals in respective response to the plurality of read masking signals.

9. The test circuit of semiconductor integrated circuit according to claim 8, wherein the output control signal generation unit provides a correspondingly inactivated output buffer control signal when any one signal of the plurality of read masking signals is activated.

10. The test circuit of semiconductor integrated circuit according to claim 6, wherein the test circuit further comprises different groups of data input and output pins, which respectively correspond to the plurality of output buffer control signals, and the data output buffer includes a plurality of output buffers which are respectively connected with the different groups of data input and output pins.

11. The test circuit of semiconductor integrated circuit according to claim 10, wherein, when any one signal of the plurality of output buffer control signals is inactivated, a corresponding output buffer is inactivated and blocks a path of the output data.

12. The test circuit of semiconductor integrated circuit according to claim 6, wherein the masking control block further includes a masking signal input buffer for buffering the plurality of data masking signals and generating a plurality of data masking activation signals.

13. A test circuit of semiconductor integrated circuit comprising:
   a data input and output control block capable of masking some of data input and output pins in write operation and read operation in response to a plurality of data masking signals when a test mode signal is activated,
   the data input and output control block comprising:
   an output control section for generating a plurality of output buffer control signals in response to the plurality of data masking signals in read operation; and
   a data output buffer controlled in activation and inactivation thereof in response to the plurality of output buffer control signals and thereby selectively masking different groups of data input and output pins.

14. The test circuit of semiconductor integrated circuit according to claim 13, wherein the output control section comprises:
   a masking signal merging unit for generating a plurality of read masking signals in response to the plurality of data masking signals; and
   an output control signal generation unit for generating the plurality of output buffer control signals in respective response to the plurality of read masking signals.

15. The test circuit of semiconductor integrated circuit according to claim 14, wherein the output control signal generation unit comprises a plurality of data pin group control parts which operate in correspondence with the respective read masking signals to control the different groups of data input and output pins.

16. The test circuit of semiconductor integrated circuit according to claim 15, wherein each data pin group control part generates a corresponding output buffer control signal in response to a read masking signal, a first output control signal activated by a read command, and the test mode signal.

17. The test circuit of semiconductor integrated circuit according to claim 16, wherein each data pin group control part generates an inactivated output buffer control signal when a merged read masking signal, the first output control signal and the test mode signal are all activated.

18. The test circuit of semiconductor integrated circuit according to claim 17, wherein the data pin group control part provides an activated output buffer control signal when a read masking signal or the test mode signal is inactivated.

19. The test circuit of semiconductor integrated circuit according to claim 13, wherein the test circuit includes different groups of data input and output pins, which respectively correspond to the plurality of output buffer control signals, and the data output buffer includes a plurality of output buffers which are respectively connected with the different groups of data input and output pins.

20. The test circuit of semiconductor integrated circuit according to claim 19, wherein each output buffer provides or blocks an output path of output data depending upon a signal level of the output buffer control signal and controls the data input and output pins connected to the output path.

* * * * *